(12) United States Patent
Park et al.

(10) Patent No.: US 11,785,753 B2
(45) Date of Patent: Oct. 10, 2023

(54) DISPLAY DEVICE

(71) Applicant: Samsung Display Co., LTD., Yongin-si (KR)

(72) Inventors: Jung Ho Park, Hwaseong-si (KR); Gyung-Kook Kwak, Seoul (KR); Jeong Il Yoo, Seoul (KR); Sung Chul Choi, Hwaseong-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 0 days.

(21) Appl. No.: 17/376,350

(22) Filed: Jul. 15, 2021

(65) Prior Publication Data

US 2022/0104405 A1    Mar. 31, 2022

(30) Foreign Application Priority Data

Sep. 28, 2020  (KR) .................. 10-2020-0125821

(51) Int. Cl.
 *H05K 5/00* (2006.01)
 *H05K 9/00* (2006.01)

(52) U.S. Cl.
 CPC .......... *H05K 9/009* (2013.01); *H05K 5/0017* (2013.01)

(58) Field of Classification Search
 CPC .... H05K 9/009; H05K 5/0017; G06F 1/1637; G06F 2200/1612; G06F 1/1601; G06F 1/1652; G06F 1/1656; G02F 1/133305; G02F 1/133308; G02F 1/133311; G09F 9/30; H01L 51/5237
 See application file for complete search history.

(56) References Cited

U.S. PATENT DOCUMENTS

| | | | | |
|---|---|---|---|---|
| 6,177,971 B1* | 1/2001 | Jung | .................. | G02F 1/133308 349/60 |
| 9,592,688 B2* | 3/2017 | Ono | ......................... | B41J 29/02 |
| 10,405,439 B2* | 9/2019 | Bao | ........................ | G06F 1/1637 |
| 10,412,843 B2* | 9/2019 | Bao | ........................ | H05K 5/0017 |
| 2010/0061040 A1* | 3/2010 | Dabov | .................. | H04M 1/026 361/679.01 |
| 2012/0149437 A1* | 6/2012 | Zurek | .................. | H04M 1/0266 455/566 |
| 2013/0242481 A1* | 9/2013 | Kim | ..................... | H04M 1/0249 361/679.01 |
| 2015/0245513 A1* | 8/2015 | Moon | ....................... | G06F 1/20 361/679.01 |
| 2016/0274297 A1* | 9/2016 | Ikuta | ....................... | G02B 6/005 |
| 2017/0099742 A1* | 4/2017 | Choi | ....................... | H05K 5/069 |
| 2018/0033571 A1 | 2/2018 | Choi et al. | | |
| 2018/0102072 A1* | 4/2018 | Lee | ........................ | G06F 1/1641 |
| 2021/0410309 A1* | 12/2021 | Zhu | ..................... | H01L 51/5253 |

FOREIGN PATENT DOCUMENTS

| | | |
|---|---|---|
| JP | 202040229 A | 3/2020 |
| KR | 1020160083651 A | 7/2016 |
| KR | 1020180002297 A | 1/2018 |
| KR | 1020200046628 A | 5/2020 |
| KR | 1020200057236 A | 5/2020 |
| WO | 2020101340 A1 | 5/2020 |

* cited by examiner

*Primary Examiner* — Abhishek M Rathod
(74) *Attorney, Agent, or Firm* — CANTOR COLBURN LLP

(57) ABSTRACT

A display device includes a flexible display portion, a case which accommodates the display portion, and a blocking layer which is disposed between the display portion and the case. The blocking layer includes a plurality of nanolines.

19 Claims, 11 Drawing Sheets

DISPLAY DEVICE

This application claims priority to Korean Patent Application No. 10-2020-0125821 filed on Sep. 28, 2020, and all the benefits accruing therefrom under 35 U.S.C. § 119, the content of which in its entirety is herein incorporated by reference.

BACKGROUND

1. Field

The present disclosure relates to a display device.

2. Description of the Related Art

A display device includes a liquid crystal display ("LCD"), a plasma display device ("PDP"), an organic light emitting diode ("OLED") display device, a field effect display ("FED"), an electrophoretic display device, or the like.

A flexible display device or a foldable display device that can be bent has been attracting attention.

However, the display device is weak against moisture or oxygen, and when moisture or oxygen inflows from the outside, an emission layer may be damaged or signal lines may be oxidized.

SUMMARY

Embodiments have made an effort to provide a display device that can prevent introduction of moisture and oxygen from outside.

It is obvious that the aspect of the embodiments is not limited to the above-described aspect, and can be variously extended in a range that does not deviate from the spirit and region of the embodiments.

A display device according to an embodiment includes a flexible display portion, a case which accommodates the display portion, and a blocking layer which is disposed between the display portion and the case, where the blocking layer includes a plurality of nanolines.

The plurality of nanolines may be nano-wire or nano-fiber particles.

The plurality of nanolines each may have a thickness of several nanometers to tens of nanometers.

The blocking layer may include a first layer including the plurality of nanolines and a second layer which is disposed on the first layer and has adhesive strength.

A thickness of the first layer may be larger than a thickness of the second layer in a thickness direction.

The case may surround a bottom surface and side surfaces of the display portion, the case may include a cover portion which covers edges of a top surface of the display portion, and the blocking layer may be disposed between the edges of the top surface of the display portion and the cover portion of the case.

A space may exist between the bottom surface and the case and between the side surfaces and the case.

The blocking layer may be disposed in the space between the bottom surface and the case and between the side surfaces and the case.

A display device according to an embodiment includes a flexible display portion, a case which accommodates the display portion, and a blocking layer which is disposed between the display portion and the case, where the case and the blocking layer surround a bottom surface and side surfaces of the display portion, and the blocking layer includes a plurality of nanolines.

According to the embodiments, the display device can prevent introduction of moisture and oxygen from outside.

It is apparent that the effect of the embodiments is not limited to the above-described effect, and can be variously extended in a range not departing from the spirit and region of the embodiments.

DETAILED DESCRIPTION

Figure 1:
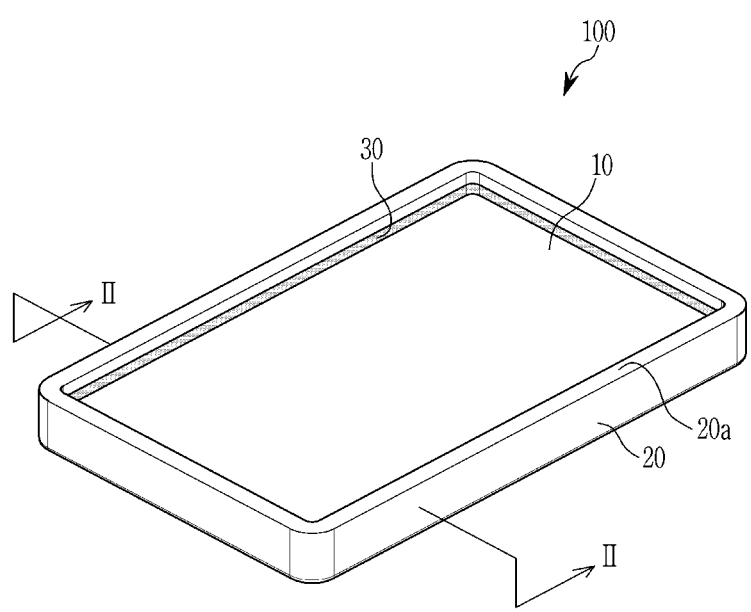
FIG. 1 is a perspective view of a display device according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In the drawings, size and thickness of each element are arbitrarily illustrated for convenience of description, and the present invention is not necessarily limited to as illustrated in the drawings. In the drawings, the thickness of layers, films, panels, regions, etc., are exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element, and will not necessarily be understood to be positioned "at an upper side" based on an opposite to gravity direction.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Throughout the specification, "connected" does not mean only when two or more constituent elements are directly connected, but also when two or more constituent elements are indirectly connected through another constituent element, or when physically connected or electrically connected, and it may include a case in which substantially integral parts are connected to each other although they are referred to by different names according to positions or functions.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Figure 2:
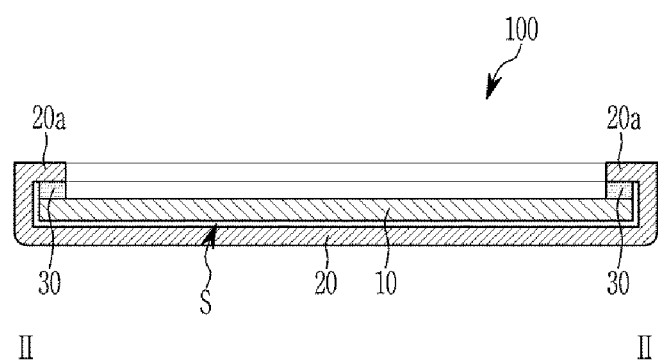
FIG. 2 is a cross-sectional view of the display device of FIG. 1 taken along line II-II.
Figure 3:
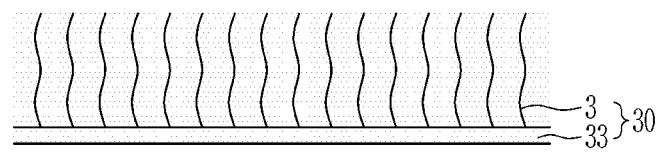
FIG. 3 is a cross-sectional view of a structure of a blocking layer according to the embodiment.

Referring to FIG. 1 to FIG. 3, a display device 100 according to an embodiment will be described. FIG. 1 is a perspective view of a display device according to an embodiment, FIG. 2 is a cross-sectional view of the display device of FIG. 1 taken along line II-II, and FIG. 3 is a cross-sectional view of a structure of a blocking layer according to the embodiment.

Referring to FIG. 1 and FIG. 2, a display device 100 includes a display portion 10 and a case 20 that accommodates the display portion 10. The case 20 surrounds a lower portion and side surfaces of the display portion 10, and includes a cover portion 20a that surrounds edges of the display portion 10.

The display portion 10 may be flexible or foldable. A direction in which the display portion 10 is folded or bent, or a structure used to be folded or bent, is not limited to any specific direction or structure, and various directions or structures are all applicable to the present embodiment.

Since the display portion 10 is foldable or bendable, a space S that can accommodate deformation in edge portions of the display portion 10 is provided between the display portion 10 and the case 20 in this embodiment.

As shown in FIG. 2, the space S is provided between the display portion 10 and the case 20, which are separated from each other.

A blocking layer 30 is disposed between the display portion 10 and the cover portion 20a of the case 20. The cover portion 20a may be located above the display portion 10 to cover edges of a top surface of the display portion 10 as shown in FIG. 2. The blocking layer 30 can prevent inflow of moisture or oxygen from the outside through a space between the display portion 10 and the cover portion 20a of case 20.

Since the blocking layer 30 has flexibility, the blocking layer 30 can be deformed together when the display portion 10 is folded or bent, and accordingly, the blocking layer 30 can still prevent inflow of moisture or oxygen from the outside while not interrupting folding or bending motion of the display portion 10.

Although it is not illustrated, the display device 100 may further include other constituent elements that are disposed between the display portion 10 and the case 20 and connected with the display portion 10, such as a driver that drives the display device 100.

Next, referring to FIG. 3, the blocking layer 30 of the display device 100 according to the embodiment will be described in more detail.

Referring to FIG. 3, the blocking layer 30 of the display device 100 according to the embodiment may include a base layer 33 and a plurality of nanolines 3 that is disposed on the base layer 33.

The plurality of nanolines 3 may be nano-wire or nano-fiber particles. The plurality of nanolines 3 may have a waterproof property (e.g., hydrophobic property). The plurality of nanolines 3 each may have a thickness of several nanometers to tens of nanometers.

Since the plurality of nanolines 3 is disposed in the blocking layer 30, the total surface area of the blocking layer 30 may be very large, and a plurality of microspaces may exist between the plurality of nanolines 3. Interfacial tension between the blocking layer 30 and a moisture layer contacting the blocking layer 30 may increase due to the large surface area of the plurality of nanolines 3 and the plurality of microspaces between the plurality of nanolines 3, and thus the moisture layer can be prevented from being introduced toward the blocking layer 30.

In addition, the surface area of the blocking layer 30 may be increased due to the plurality of nanolines 3, and accordingly, a weak attraction exists due to Van der Waals forces acting between the blocking layer 30 and the adjacent display portion 10 and between the blocking layer 30 and the case 20. As a result, the blocking layer 30 can have adhesive strength, and thus can be disposed between the display portion 10 and the case 20 without an additional adhesive layer.

The blocking layer 30 may be formed by regularly or irregularly laminating the plurality of nanolines 3 on the base layer 33. However, a method of forming the blocking layer 30 including the plurality of nanolines 3 according to the invention is not limited thereto, and various other methods may be applied.

As described, the blocking layer 30 includes the plurality of nanolines 3, and the microspaces exist between adjacent nanolines 3. Due to the microspaces between the plurality of nanolines 3, the shape of the blocking layer 30 can be easily deformable while keeping the waterproof function. Therefore, the blocking layer 30 can be deformed together when the display portion 10 is folded or bent.

Figure 4A:
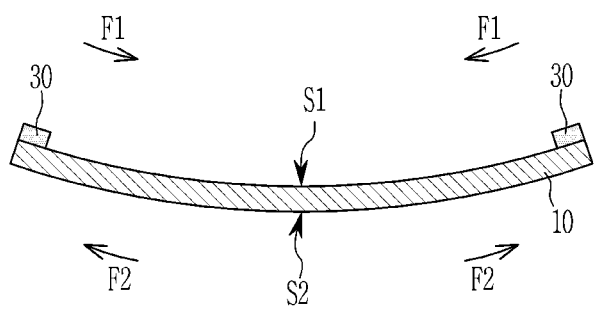
FIG. 4A and FIG. 4B are schematic views provided for description of bending operation of the display device according to the embodiment.
Figure 4B:
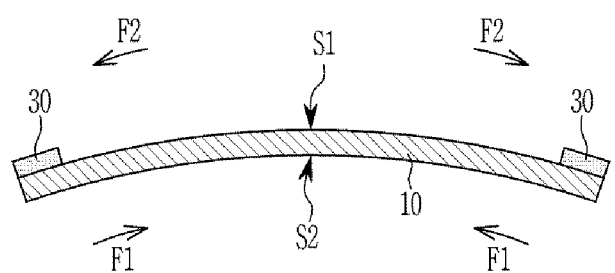

Next, referring to FIG. 4A and FIG. 4B, bending operation of the display device according to the embodiment will be described. FIG. 4A and FIG. 4B are schematic views provided for description of bending operation of the display device according to the embodiment.

Referring to FIG. 4A, the display portion 10 of the display device 100 may be bent upward such that is has a curvature radius located at a first side S1 of the display portion 10. In this case, a first force F1 may be applied to the first side S1 of the display portion 10 in a direction toward a center from an edge of the first side S1, and a second force F2 may be applied to a second side S2 that is disposed opposite to the first side S1 in a direction toward an edge from the center of the second force F2.

Accordingly, the first side S1 of the display portion 10 may be reduced, and the second side S2 may be expanded.

In this case, since the blocking layers 30 disposed along the edges of the first side S1 of the display portion 10 include the plurality of nanolines 3 and the microspaces are provided between the plurality of nanolines 3 of the blocking layer 30, the blocking layer 30 can be deformed together according to the deformation of the first surface S1 of the display portion 10 by the first force F1 applied to the first surface S1 of the display portion 10.

Thus, the blocking layer 30 can prevent moisture and the like, which can be externally introduced, from dispersing between the display portion 10 and the case 20 by being disposed between the display portion 10 and the case 20 as described above, while not interrupting deformation of the display portion 10.

Next, referring to FIG. 4B, the display portion 10 of the display device 100 may be bent downward such that it has a curvature radius located at a second side S2 of the display portion 10. In this case, the second force F2 may be applied to the first side S1 in the direction toward the edge from the center of the first side S1, and the first force F1 may be applied to the second side S2, which is disposed opposite to the first side S1 of the display portion 10, in the direction toward the center from the edge of the second side S2.

Thus, the first side S1 of the display portion 10 may be expanded, and the second side S2 may be reduced.

In this case, since the blocking layers 30 disposed along the edges of the first side S1 of the display portion 10 include the plurality of nanolines 3 and the microspaces exist between the plurality of nanolines 3 of the blocking layer 30, the blocking layer 30 can be deformed together therewith according to the deformation of the first surface S1 of the display portion 10 by the second force F2 applied to the first surface S1 of the display portion 10.

Thus, the blocking layer 30 can prevent moisture and the like, which can be externally introduced, from dispersing between the display portion 10 and the case 20 by being disposed between the display portion 10 and the case 20 as described above, while not interrupting deformation of the display portion 10.

Next, a display device according to another embodiment will be described with reference to FIG. 5 and FIG. 6.

Figure 5:
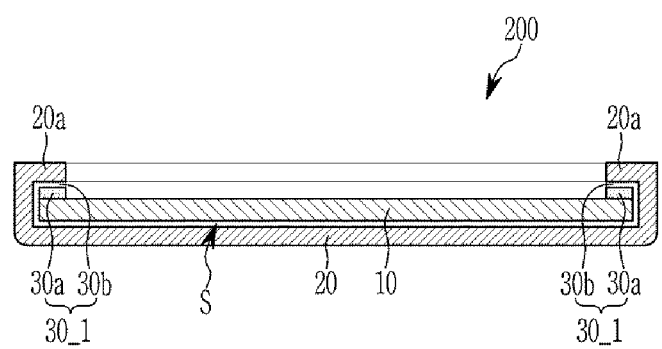
FIG. 5 is a cross-sectional view of a display device according to another embodiment.

Referring to FIG. 5, a display device according to the present embodiment is similar to the display device 100 according to the embodiment described with reference to FIG. 1 and FIG. 2. A detailed description of the same constituent elements will be omitted.

As shown in FIG. 5, the display device 200 includes a display portion 10 and a case 20 that accommodates the display portion 10. The case 20 surrounds a lower portion and side surfaces of the display portion 10, and includes a cover portion 20a that surrounds edges of the display portion 10. The display portion 10 and the case 20 are separated from each other, and thus a space exists between the display portion 10 and the case 20.

A blocking layer 30_1 is disposed between the display portion 10 and the cover portion 20a of the case 20. The cover portion 20a may be located above the display portion 10 to cover edges of a top surface of the display portion 10 as shown in FIG. 5. The blocking layer 30_1 can prevent inflow of moisture or oxygen from the outside through a space between the display portion 10 and the cover portion 20a of case 20.

Next, referring to FIG. 6, the blocking layer of the display device according to the present embodiment will be described.

Figure 6:
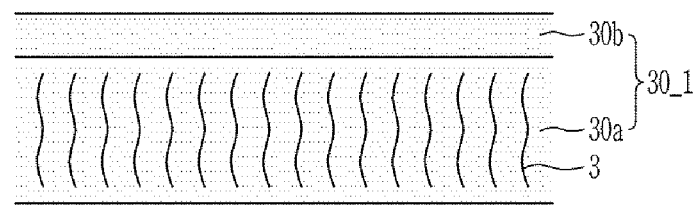
FIG. 6 is a cross-sectional view that conceptually shows a structure of a blocking layer according to another embodiment.

Referring to FIG. 6, the blocking layer of the display device 200 according to the embodiment may include a first layer 30a, and a second layer 30b that is disposed on the first layer 30a.

The first layer 30a of the blocking layer 30_1 includes a plurality of nanolines 3, and the plurality of nanolines 3 may be nano-wires or nano-fibers particles, and may have a waterproof property (e.g., hydrophobic property).

The second layer 30b of the blocking layer 30_1 may have adhesive strength. A thickness of the first layer 30a of the blocking layer 30_1 may be larger than a thickness of the second layer 30b of the blocking layer 30_1. Here, the thicknesses of the first layer 30a and the second layer 30b are lengths of the first layer 30a and the second layer 30b, respectively, measured in a direction (i.e., thickness direction) perpendicular to a major surface plane of the second layer 30b. The thickness of the first layer 30a may be equal to or more than a length of the nanoline 3.

Since the plurality of nanolines 3 is disposed in the first layer 30a of the blocking layer 30_1, the total surface area of the first layer 30a of the blocking layer 30_1 may be very large, and a plurality of microspaces exist between the plurality of nanolines 3. Interfacial tension between the blocking layer 30_1 and a moisture layer contacting the blocking layer 30_1 may increase due to the large surface area of the plurality of nanolines 3 and the plurality of microspaces between the plurality of nanolines 3 of the blocking layer 30_1, and thus the moisture layer can be prevented from being introduced toward the blocking layer 30_1.

The plurality of nanolines 3 of the first layer 30a may be formed by regularly or irregularly shredding a raw material thereof. However, a method for forming the first layer 30a of the blocking layer 30_1 including the plurality of nanolines 3 according to the invention is not limited thereto, and various other methods may be applied.

The second layer 30b of the blocking layer 30 may be formed by coating a material layer having an adhesive property on the plurality of nanolines 3.

The first layer 30a of the blocking layer 30 includes the plurality of nanolines 3, and microspaces exist between adjacent nanolines 3. As described, due to the microspaces between the plurality of nanolines 3, the shape of the first layer 30a of the blocking layer 30 can be easily changed while keeping the waterproof function. Therefore, the blocking layer 30 can be deformed together when the display portion 10 is folded or bent.

As previously described, the thickness of the first layer 30a of the blocking layer 30 may be larger than the thickness of the second layer 30b of the blocking layer 30 in the thickness direction. As described, since the thickness of the second layer 30b of the blocking layer 30 is smaller than the thickness of the first layer 30a of the blocking layer 30, the second layer 30b can be deformed together as the first layer 30a of the blocking layer 30 is deformed. Even in a case that the second layer 30b of the blocking layer 30 includes a material that is more difficult to deform than the first layer 30a of the blocking layer 30, the second layer 30b may also be deformed according to the deformation of the first layer 30a of the blocking layer 30 because the second layer 30b is thinner than the first layer 30a.

The second layer 30b of the blocking layer 30 has adhesive strength, and accordingly, the adhesive strength between the display portion 10 and the cover portion 20a of the case 20 can be increased by the blocking layer 30.

The features of the display device 100 and the blocking layer 30 described with reference to FIG. 1 to FIG. 3, FIG. 4A, and FIG. 4B are applicable to the present embodiment.

Figure 7:
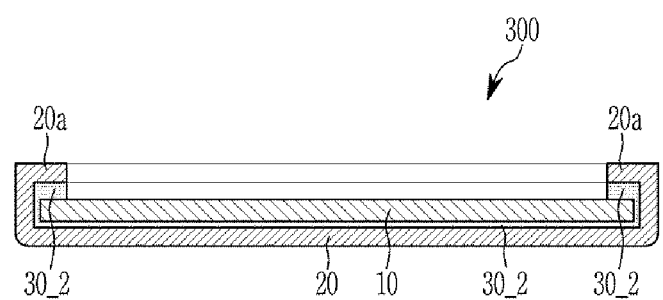
FIG. 7 is a cross-sectional view of a display device according to another embodiment.

Next, referring to FIG. 7, a display device according to another embodiment will be described. FIG. 7 is a cross-sectional view of a display device according to another embodiment.

Referring to FIG. 7, a display device 300 according to the present embodiment is similar to the display device 100 according to the embodiment described with reference to FIG. 1 and FIG. 2. A detailed description of the same constituent elements will be omitted.

As shown in FIG. 7, the display device 300 includes a display portion 10 and a case 20 that accommodates the display portion 10. The case 20 surrounds a lower portion and side surfaces of the display portion 10, and includes a cover portion 20a that surrounds edges of the display portion 10. The display portion 10 and the case 20 are separated from each other, and thus a space exists between the display portion 10 and the case 20.

In the display device 300 according to the present embodiment, a blocking layer 30_2 is disposed not only between the display portion 10 and the cover portion 20a of the case 20 but also between the display portion 10 and the other parts of the case 20. The cover portion 20a may be located above the display portion 10 to cover edges of a top surface of the display portion 10 as shown in FIG. 7.

The blocking layer 30_2 may be disposed to surround the upper, side, and lower edges of the display portion 10. As described, the blocking layer 30_2 is disposed to surround the display portion 10 and the case 20, and thus it is possible to prevent inflow of moisture or oxygen into a place between the display portion 10 and the case 20 from the outside.

The blocking layer 30_2 of the display device 300 according to the present embodiment is similar to the blocking layer 30 according to the embodiment of FIG. 3.

The blocking layer 30_2 includes a plurality of nanolines 3. The plurality of nanolines 3 may be nano-wire or nano-fiber particles. The plurality of nanolines 3 may have a waterproof property (e.g., hydrophobic property). Each of the nanolines 3 may have a thickness of several nanometers to tens of nanometers.

Interfacial tension between the blocking layer 30_2 and a moisture layer contacting the blocking layer 30_2 may increase due to the large surface area of the plurality of nanolines 3 and the plurality of microspaces between the plurality of nanolines 3 of the blocking layer 30_2, and thus the moisture layer can be prevented from being introduced toward the blocking layer 30_2.

In addition, the total surface area of the blocking layer 30_2 may be increased due to the plurality of nanolines 3 disposed in the blocking layer 30_2, and accordingly, a weak attraction exists due to Van der Waals forces acting between the blocking layer 30_2 and the adjacent display portion 10 and between the blocking layer 30_2 and the case 20. As a result, the blocking layer 30_2 can have adhesive strength, and thus can be disposed between the display portion 10 and the case 20 without an additional adhesive layer.

The blocking layer 30_2 can be easily deformable while keeping the waterproof function. Therefore, the blocking layer 30_2 can be deformed together when the display portion 10 is folded or bent.

The features of the display devices according to the above-described embodiments are applicable to the display device according to the present embodiment.

Figure 8:
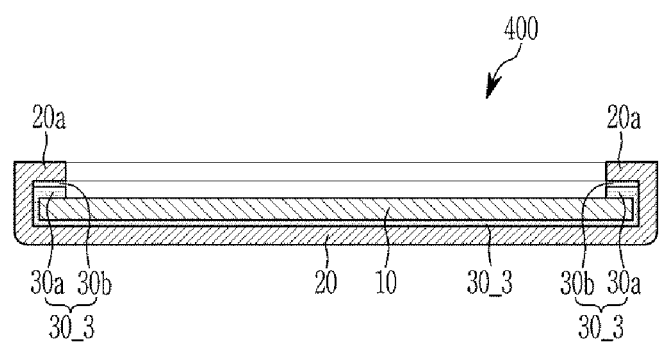
FIG. 8 is a cross-sectional view of a display device according to still another embodiment.

Referring to FIG. 8, a display device according to still another embodiment will be described. FIG. 8 is a cross-sectional view of a display device according to another embodiment.

A display device 400 according to the present embodiment is similar to the display devices according to the above-described embodiments. A detailed description of the same constituent elements will be omitted.

Referring to FIG. 8, the display device 400 includes a display portion 10 and a case 20 that accommodates the display portion 10. The case 20 surrounds a lower portion and side surfaces of the display portion 10, and includes a cover portion 20a that surrounds edges of the display portion 10. The display portion 10 and the case 20 are separated from each other, and thus a space exists between the display portion 10 and the case 20.

In the display device 400 according to the present embodiment, a blocking layer 30_3 is disposed not only between the display portion 10 and the cover portion 20a of the case 20, but also between the display portion 10 and the remaining part of the case 20. The cover portion 20a may be located above the display portion 10 to cover edges of a top surface of the display portion 10 as shown in FIG. 8.

The blocking layer 30_3 may be disposed to surround the upper, side, and lower edges of the display portion 10. As described, the blocking layer 30_3 is disposed to surround the display portion 10 and the case 20, and thus it is possible to prevent inflow of moisture or oxygen into a place between the display portion 10 and the case 20 from the outside.

The blocking layer 30_3 of the display device 400 according to the present embodiment is similar to the blocking layer 30_1 according to the embodiment of FIG. 6.

The first layer 30a of the blocking layer 30_3 includes a plurality of nanolines 3, and the plurality of nanolines 3 may be nano-wire or nano-fiber particles, and may have a waterproof property (e.g., hydrophobic property). Each of the nanolines 3 may have a thickness of several nanometers to tens of nanometers.

The second layer 30b of the blocking layer 30_3 may have adhesive strength. A thickness of the first layer 30a of the blocking layer 30_3 may be larger than a thickness of the second layer 30b of the blocking layer 30_3 in the thickness direction.

Interfacial tension between the blocking layer 30_3 and a moisture layer contacting the blocking layer 30_3 may increase due to the large surface area of the plurality of nanolines 3 and the plurality of microspaces between the plurality of nanolines 3, and thus the moisture layer can be prevented from being introduced toward the blocking layer 30_3.

In addition, the total surface area of the blocking layer 30_3 may be increased due to the plurality of nanolines 3 disposed in the blocking layer 30_3, and accordingly, a weak attraction exists due to Van der Waals forces acting between the blocking layer 30_3 and the adjacent display portion 10 and between the blocking layer 30_3 and the case 20. As a result, the blocking layer 30_3 can have adhesive strength, and thus can be disposed between the display portion 10 and the case 20 without an additional adhesive layer.

In addition, the blocking layer 30_3 further includes the second layer 30b having adhesive strength, and thus adhesive strength of the blocking layer 30_3 can be further increased.

The blocking layer 30_3 can be easily deformable while keeping the waterproof function. Therefore, the blocking layer 30_3 can be deformed together when the display portion 10 is folded or bent.

The features of the display devices according to the above-described embodiments are applicable to the display device according to the present embodiment.

Figure 9:
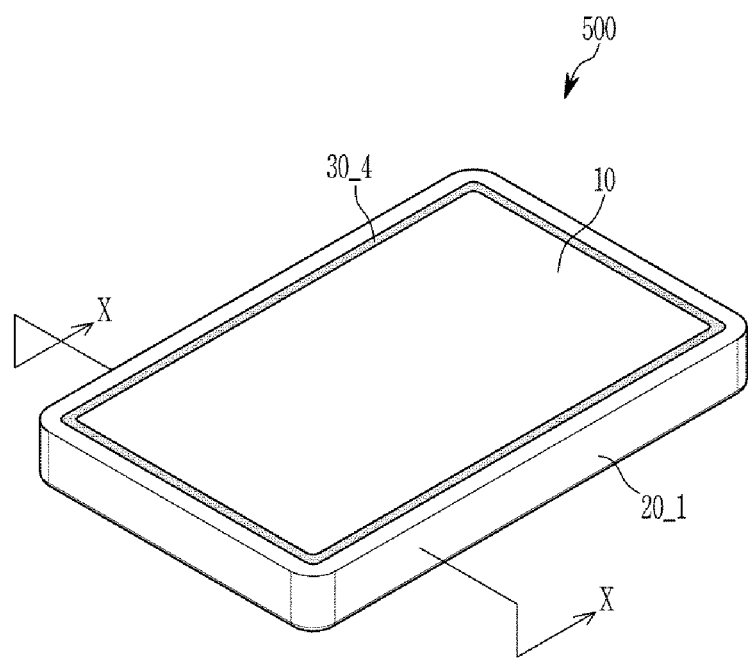
FIG. 9 is a perspective view of a display device according to another embodiment

Next, referring to FIG. 9 and FIG. 10, a display device according to another embodiment will be described. FIG. 9 is a perspective view of a display device according to the another embodiment, and FIG. 10 is a cross-sectional view of FIG. 9, taken along line X-X.

Figure 10:
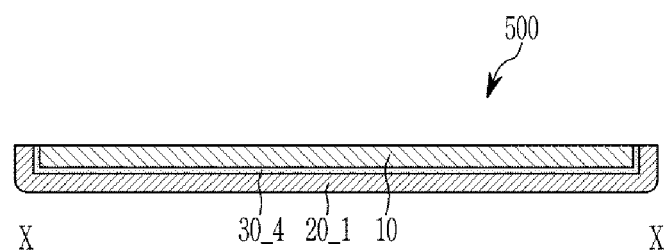
FIG. 10 is a cross-sectional view of FIG. 9, taken along line X-X.

Referring to FIG. 9 and FIG. 10, a display device 500 according to the present embodiment is similar to the display devices according to the above-described embodiments. A detailed description of the same constituent elements will be omitted.

Referring to FIG. 9 and FIG. 10, a display device 500 according to the present embodiment includes a display portion 10 and a case 20_1 that accommodates the display portion 10. The case 20_1 is disposed to surround a lower portion and side surfaces of the display portion 10. The display portion 10 and the case 20_1 are separated from each other, and thus a space exists between the display portion 10 and the case 20_1.

Unlike the above-described embodiments (e.g., embodiments in FIGS. 1 to 8), the case 20_1 does not include a cover portion 20a.

In the display device 500 according to the present embodiment, a blocking layer 30 is positioned between display portion 10 and the case 20_1.

The blocking layer 30_4 may be disposed to surround all of the side surfaces and the bottom surface of the display portion 10. As described, the blocking layer 30_4 is disposed to surround the display portion 10 and the case 20_1, and thus it is possible to prevent inflow of moisture or oxygen into a place between the display portion 10 and the case 20_1 from the outside.

The blocking layer 30_4 of the display device 500 according to the present embodiment is similar to the blocking layer 30 according to the embodiment of FIG. 3.

The blocking layer 30_4 includes a plurality of nanolines 3. The plurality of nanolines 3 may be nano-wire or nano-fiber particles. The plurality of nanolines 3 may have a waterproof property (e.g., hydrophobic property). Each of the nanolines 3 may have a thickness of several nanometers to tens of nanometers.

Interfacial tension between the blocking layer 30_4 and a moisture layer contacting the blocking layer 30_4 may increase due to the large surface area of the plurality of nanolines 3 and the plurality of microspaces between the plurality of nanolines 3 of the blocking layer 30_4, and thus the moisture layer can be prevented from being introduced toward the blocking layer 30_4.

In addition, the total surface area of the blocking layer 30_4 may be increased clue to the plurality of nanolines 3 disposed in the blocking layer 30_4, and accordingly, a weak attraction exists due to Van der Waals forces acting between the blocking layer 30_$ and the adjacent display portion 10 and between the blocking layer 30_4 and the case 20_1. As a result, the blocking layer 30_4 can have adhesive strength, and thus can be disposed between the display portion 10 and the case 20_1 without an additional adhesive layer.

The blocking layer 30_4 can be easily deformable while keeping the waterproof function. Therefore, the blocking layer 30_4 can be deformed together when the display portion 10 is folded or bent.

The features of the display devices according to the above-described embodiments are applicable to the display device according to the present embodiment.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

<Description of symbols>

| | |
|---|---|
| 100, 200, 300, 400, 500: display device | |
| 10: display portion | 20: case |
| 30: blocking layer | 3: nanolines |
| F1, F2: force | S1, S2: side |
| S: space | |

What is claimed is:

1. A display device comprising:
   a flexible display portion;
   a case which accommodates the display portion; and
   a blocking layer which is disposed between the display portion and the case,
   wherein the blocking layer comprises a plurality of nanolines, and
   wherein the blocking layer covers and directly contacts an entirety of a bottom surface and side surfaces of the display portion.

2. The display device of claim 1, wherein the plurality of nanolines are nano-wire or nano-fiber particles.

3. The display device of claim 2, wherein the plurality of nanolines each has a thickness of several nanometers to tens of nanometers.

4. A display device comprising:
   a flexible display portion;
   a case which accommodates the display portion; and
   a blocking layer which is disposed between the display portion and the case,
   wherein the blocking layer comprises:
   a first layer including a plurality of nanolines; and
   a second layer which is disposed on the first layer, and has adhesive strength, and
   wherein the blocking layer directly contacts an entirety of a bottom surface and side surfaces of the display portion.

5. The display device of claim 4, wherein a thickness of the first layer is larger than a thickness of the second layer in a thickness direction.

6. The display device of claim 1, wherein the case surrounds the bottom surface and side surfaces of the display portion,
   the case comprises a cover portion which covers edges of a top surface of the display portion, and
   the blocking layer is disposed between the edges of the top surface of the display portion and the cover portion of the case.

7. The display device of claim 6, wherein the plurality of nanolines are nano-wire or nano-fiber particles.

8. The display device of claim 7, wherein the plurality of nanolines each has a thickness of several nanometers to tens of nanometers.

9. A display device comprising:
   a flexible display portion;
   a case which accommodates the display portion; and
   a blocking layer which is disposed between the display portion and the case, wherein the case surrounds a bottom surface and side surfaces of the display portion, the case comprises a cover portion which covers edges of a top surface of the display portion, and the blocking layer is disposed between the edges of the top surface of the display portion and the cover portion of the case, wherein the blocking layer comprises:

a first layer including a plurality of nanolines; and a second layer which is disposed on the first layer, and has adhesive strength, and wherein the blocking layer directly contacts an entirety of the bottom surface and the side surfaces of the display portion.

10. The display device of claim 9, wherein a thickness of the first layer is larger than a thickness of the second layer in a thickness direction.

11. The display device of claim 1, wherein the blocking layer is disposed in the space between the bottom surface and the case and between the side surfaces and the case.

12. The display device of claim 11, wherein the plurality of nanolines are nano-wire or nano-fiber particles.

13. The display device of claim 12, wherein the plurality of nanolines each has a thickness of several nanometers to tens of nanometers.

14. A display device comprising:

a flexible display portion;

a case which accommodates the display portion; and a blocking layer which is disposed between the display portion and the case, wherein the case surrounds a bottom surface and side surfaces of the display portion, the case comprises a cover portion which covers edges of a top surface of the display portion, the blocking layer is disposed between the edges of the top surface of the display portion and the cover portion of the case, wherein no space exists between the bottom surface and the display portion and between the side surfaces and the display portion, and wherein the blocking layer is disposed in the space between the bottom surface and the case and between the side surfaces and the case, wherein the blocking layer comprises:

a first layer including a plurality of nanolines; and a second layer which is disposed on the first layer, and has adhesive strength.

15. The display device of claim 14, wherein a thickness of the first layer is larger than a thickness of the second layer in a thickness direction.

16. A display device comprising:

a flexible display portion;

a case which accommodates the display portion; and a blocking layer which is disposed between the display portion and the case, wherein the blocking layer covers and directly contacts an entirety of a bottom surface and side surfaces of the display portion, and the blocking layer comprises a plurality of nanolines.

17. The display device of claim 16, wherein the plurality of nanolines are nano-wire or nano-fiber particles.

18. The display device of claim 17, wherein the plurality of nanolines each has a thickness of several nanometers to tens of nanometers.

19. The display device of claim 1, wherein microspaces exist between the plurality of nanolines of the blocking layer.

* * * * *